(12) United States Patent
Lamouroux et al.

(10) Patent No.: US 12,325,666 B2
(45) Date of Patent: Jun. 10, 2025

(54) METHOD FOR DENSIFICATION BY CHEMICAL VAPOUR INFILTRATION

(71) Applicant: SAFRAN CERAMICS, Le Haillan (FR)

(72) Inventors: Franck Lamouroux, Moissy-Cramayel (FR); Adrien Delcamp, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 18/708,915

(22) PCT Filed: Nov. 9, 2022

(86) PCT No.: PCT/FR2022/000099
§ 371 (c)(1),
(2) Date: May 9, 2024

(87) PCT Pub. No.: WO2023/084161
PCT Pub. Date: May 19, 2023

(65) Prior Publication Data
US 2024/0327299 A1    Oct. 3, 2024

(30) Foreign Application Priority Data

Nov. 10, 2021 (FR) ...................................... 2111929

(51) Int. Cl.
*C04B 41/45* (2006.01)
*C04B 35/622* (2006.01)

(52) U.S. Cl.
CPC ...... *C04B 35/62281* (2013.01); *C04B 41/457* (2013.01); *C04B 41/4584* (2013.01); *C04B 2235/614* (2013.01); *C04B 2235/6581* (2013.01)

(58) Field of Classification Search
CPC ............ C04B 35/62281; C04B 41/457; C04B 41/4584; C04B 2235/614;
(Continued)

(56) References Cited

U.S. PATENT DOCUMENTS 4,582,751 A * 4/1986 Vasilos .................... C04B 41/85
428/307.3
5,695,818 A * 12/1997 Soffer ................. C04B 41/5001
427/249.1
(Continued)

FOREIGN PATENT DOCUMENTS

FR          2 700 330 A1    7/1994
KR    10-2019-0068323 A    6/2019

OTHER PUBLICATIONS

Science Notes, "What is Room Temperature?", 2020, p. 1-5 (Year: 2020).*

(Continued)

*Primary Examiner* — Gordon Baldwin
*Assistant Examiner* — Christina D McClure
(74) *Attorney, Agent, or Firm* — Pillsbury Winthrop Shaw Pittman LLP

(57) ABSTRACT

A method for densification by Chemical Vapor Infiltration of a plurality of fibrous preforms arranged in the enclosure of a densification furnace, the method including at least the following procedures a) and b), each being repeated more than once: a) introducing a first gaseous phase, the thermal decomposition of which allows the matrix to form in the pores of the plurality of fibrous preforms; b) introducing a second gaseous phase while simultaneously placing the enclosure of the furnace under vacuum, such that the introduction of the second gaseous phase takes place at the same time as the expulsion of the first gaseous phase out of the enclosure, the temperature of the second gaseous phase being less than or equal to 25° C. when it is introduced into the enclosure of the furnace.

15 Claims, 2 Drawing Sheets

(58) Field of Classification Search
CPC ...... C04B 2235/6581; C04B 2235/483; C04B 2235/5244; C04B 2235/658; C04B 35/565; C04B 35/80; C01B 32/977; C23C 16/325; C23C 16/45502; C23C 16/45523; C23C 16/463; C23C 16/466; C23C 16/045

See application file for complete search history.

(56) References Cited

U.S. PATENT DOCUMENTS

| | | | | |
|---|---|---|---|---|
| 5,738,951 | A * | 4/1998 | Goujard | C04B 35/565 428/688 |
| 6,001,419 | A * | 12/1999 | Leluan | C04B 35/80 427/255.12 |
| 6,639,196 | B1 * | 10/2003 | Fiala | F27B 5/16 118/724 |
| 2004/0009113 | A1 * | 1/2004 | Sion | C04B 35/83 422/150 |
| 2007/0172639 | A1 * | 7/2007 | Kmetz | C04B 35/62863 428/307.3 |
| 2023/0395774 | A1 * | 12/2023 | Tillmann | C23C 16/4417 |

OTHER PUBLICATIONS

Written Opinion of the International Searching Authority as issued in International Patent Application No. PCT/FR2022/000099, dated Feb. 3, 2023.

International Search Report as issued in International Patent Application No. PCT/FR2022/000099, dated Feb. 3, 2023.

* cited by examiner

[Fig. 1]
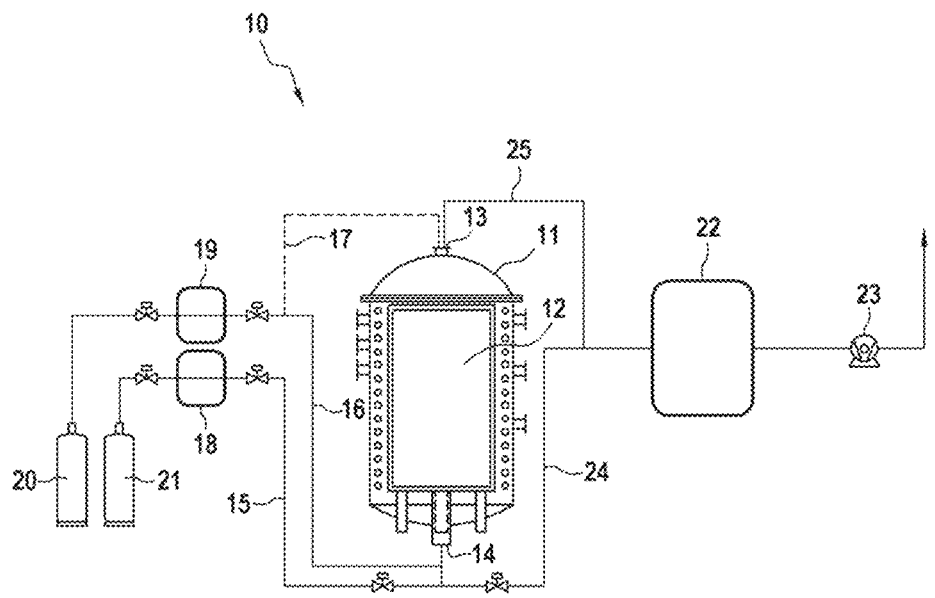
[Fig. 2]
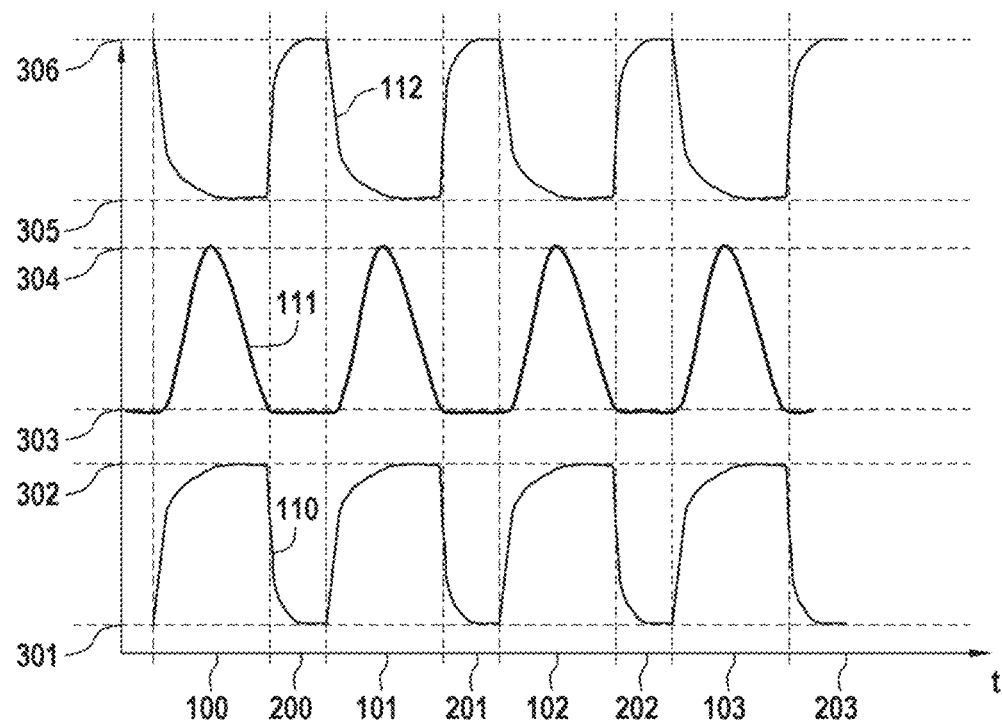

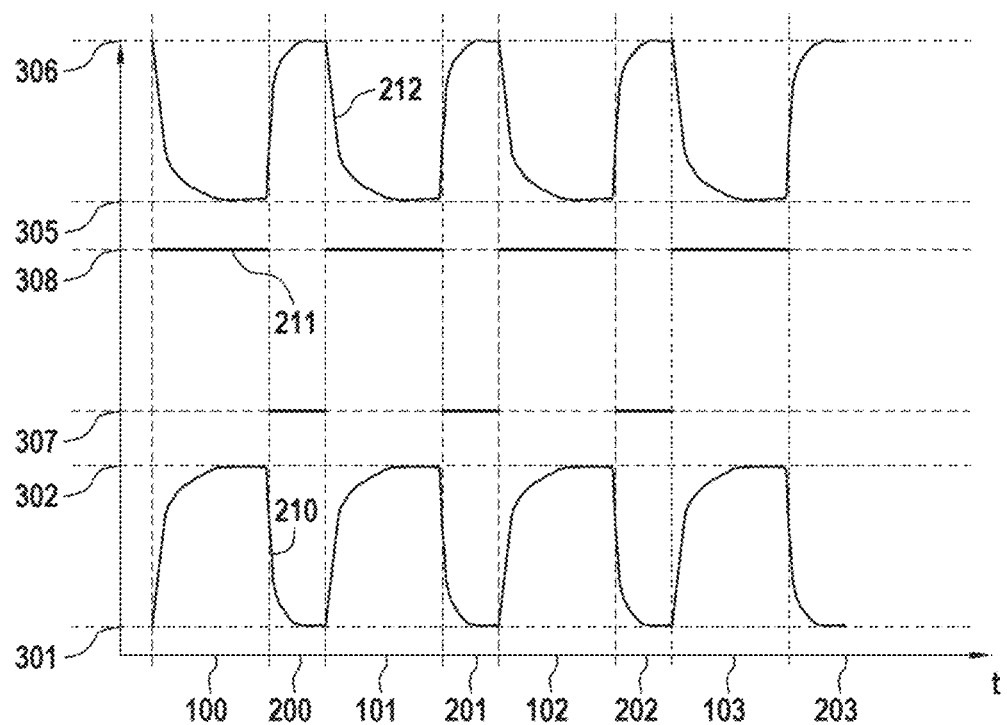

METHOD FOR DENSIFICATION BY CHEMICAL VAPOUR INFILTRATION

CROSS-REFERENCE TO RELATED APPLICATIONS

This application is the U.S. National Stage of PCT/FR2022/000099, filed Nov. 9, 2022, which in turn claims priority to French patent application number 2111929 filed Nov. 10, 2021. The content of these applications are incorporated herein by reference in their entirety.

TECHNICAL FIELD

The invention relates to the field of composite materials, and more specifically to the field of Chemical Vapor Infiltration methods used to obtain these materials by densifying a fibrous preform.

PRIOR ART

Composite material parts are the focus of growing technological interest due to the good trade-off they offer in terms of strength and weight.

Obtaining composite material parts by Chemical Vapor Infiltration or by chemical vapor deposition, using a fibrous preform, is known. Such methods use a reactive gaseous phase, the decomposition of which allows the desired matrix to form. This reactive gaseous phase is introduced into the pores of fibrous preforms which are themselves positioned in a densification furnace, and the conditions of the furnace are chosen so that the gaseous phase decomposes and forms the matrix of the composite material part directly in the pores of the fibrous preforms. The choice of the gas constituting the gaseous phase and the temperature and pressure conditions prevailing in the furnace determine the nature of the matrix formed in the composite material parts.

One of the limits of Chemical Vapor Infiltration methods is the fact that it is difficult to densify the core of the fibrous preform. Indeed, as described above, the matrix is formed directly in the pores of the substrate during the method, as a result of the decomposition of the reactive gaseous phase. During the method, this decomposition obstructs the pores near the surface of the fibrous preforms, making it more difficult for the gaseous phase to access the pores at the core of the preforms. Moreover, the gaseous phase that reaches the core is less rich in reagents, because some of it has already decomposed at the surface. The further the method advances, the more difficult it becomes to densify the core, until the surface pores are completely obstructed and it becomes impossible to densify the core. The outcome is a high level of residual porosity in the resulting part.

In order to improve the densification of the core of preforms, taking advantage of the kinetics of the reaction that forms the matrix is generally proposed. For example, providing a temperature gradient between the core of preforms and their surfaces means that the matrix is deposited more quickly in the hotter core of the preform before being deposited in the pores closer to the surface, helping to improve the densification of the core of preforms.

Creating the temperature gradients that are needed in order to implement the solution proposed above is relatively straightforward when the preforms are conductive, for example when the preforms are made from carbon, because it is then possible to generate the gradient by thermal induction coupling.

However, it is not possible to implement thermal induction coupling when using ceramic preforms because such preforms do not conduct current. There therefore remains a need for a Chemical Vapor Infiltration method that helps improve the rate of densification achieved for ceramic preforms.

DISCLOSURE OF THE INVENTION

The inventors propose a method providing a solution to the problems described above.

For this purpose, they propose a method for densification by Chemical Vapor Infiltration of a plurality of fibrous preforms arranged in the enclosure of a densification furnace, the method comprising at least the following steps a) and b), each being repeated more than once:
  a) introducing a first gaseous phase, the thermal decomposition of which allows the matrix to form in the pores of the plurality of fibrous preforms;
  b) introducing a second gaseous phase while simultaneously placing the enclosure of the furnace under vacuum, such that the introduction of the second gaseous phase takes place at the same time as the expulsion of the first gaseous phase out of the enclosure, the temperature of the second gaseous phase being less than or equal to 25° C. when it is introduced into the enclosure of the furnace.

The inventors have observed that such a method, and in particular the introduction of the second gaseous phase at the indicated temperature, temporarily cools the surface of the fibrous preforms and thus creates a temperature gradient on the surface of the fibrous preform. The kinetics of the reaction that forms the matrix is then reduced at the surface of the preform but not in the core of the preform, which remains hotter, and densification becomes faster at the core of the preform than at the surface. This results in a densification method that makes it possible to obtain residual porosity levels that cannot be achieved when using conventional isothermal and isobaric densification methods.

Moreover, the purging of the reactive gases contained in the first gaseous phase, which is carried out at the same time as the cooling of the preforms, ensures that the first gaseous phase is always rich in reactive gases. Finally, repeating the steps a) and b) in alternation helps ensure that the desired temperature gradient between the core and the surface of the fibrous preforms is maintained over the entire duration of the method.

In one embodiment, the preforms comprise or are constituted by silicon carbide fibers.

The method is actually particularly advantageous when using preforms made from SiC fibers, because it is not possible with the latter to create a temperature gradient by inductive coupling. Indeed, such preforms do not conduct current.

In one embodiment, the first gaseous phase comprises methyltrichlorosilane and hydrogen. These substances make it possible to form a silicon carbide SiC matrix. In one embodiment, the preforms comprise or are constituted by silicon carbide fibers, and the method then makes it possible to form SiC-SiC composite materials whose residual porosity is particularly low in comparison with those that can be obtained using the methods of the prior art.

In one embodiment, the second gaseous phase comprises hydrogen, helium, nitrogen or a mixture of these substances. Such substances are advantageous because they will not form undesirable by-products in the enclosure of the densification furnace. These substances also offer very good thermal conductivity, making it possible to form the desired temperature gradient at the surface of the preforms while minimizing the duration of the step b), which consequently reduces the duration of the densification method.

In one embodiment, the pressure applied in the enclosure of the furnace during the step b) is less than or equal to 200 mbar. Having a low pressure in the enclosure of the furnace makes it possible to purge the first gaseous phase when the second gaseous phase is introduced.

In one embodiment, a step b) is interrupted by a new step a) when the temperature at the surface of the fibrous preforms is less than or equal to 800° C.

For example, the temperature at the surface of the fibrous preforms may be measured using infrared pyrometry. Controlling the surface temperature of the fibrous preforms helps ensure that the temperature gradient between the core and the surface is that desired for the densification method. In particular, the inventors have observed that a surface temperature of the fibrous preforms less than or equal to 800° C., with densification conditions that are otherwise in line with those of the prior art, represents an optimum temperature gradient enabling an increase in preform densification while also ensuring that the cooling steps are not too long.

In one embodiment, the setpoint temperature of the enclosure of the densification furnace may be less than or equal to 1100° C. during the steps a), for example being between 800° C. and 1100° C.

In one embodiment, a step a) may be interrupted by a step b) when the temperature at the surface of the preforms is greater than or equal to 1000° C.

Indeed, if the surface temperature of the preforms becomes too high, the temperature gradient between the core and the surface is less than the desired gradient, and optimum densification is not achieved.

In one embodiment, the duration of the steps b) is less than or equal to 5 minutes. The inventors have observed that cooling steps b) of this duration make it possible to obtain a temperature gradient that is sufficient to achieve the desired increase in densification at the end of the method.

In one embodiment, the two gaseous phases circulate co-currently. In this embodiment, the two gaseous phases follow a similar path through the furnace, and in particular through the fibrous preforms.

In this case, the cooling induced by the introduction of the second gaseous phase during the step b) acts more effectively on the zone of the reactor where the deposition kinetics are greatest during the step a) due to the richness of the reactive gases.

In one embodiment, the two gaseous phases circulate counter-current to each other. In this embodiment, the first and the second gaseous phases follow opposing paths through the enclosure of the densification furnace, and in particular through the fibrous preforms.

In this case, the circulation of the second gaseous phase in the opposite direction during the step b) will have the effect of breaking the boundary layer surrounding the fibrous preforms, which, as well as cooling the parts, will facilitate the renewal of the first gaseous phase during the step a).

In one embodiment, a calibrated quantity of first gaseous phase is introduced during each step a). For example, the circuit for introducing the first gaseous phase comprises a supply chamber upstream of the densification furnace ensuring that the quantity of first gaseous phase delivered during each step a) is limited to the quantity contained in this supply chamber.

This embodiment makes it possible to know the precise quantity of first gaseous phase introduced into the enclosure of the densification furnace at each step a), and therefore to limit the duration of each step a) to the time necessary for this introduced quantity of first gaseous phase to decompose. This results in a method in which the precise duration of each step a) can be known and be relatively short.

For example, in this embodiment, the duration of each step a) may be less than or equal to one minute, or indeed less than or equal to 30 seconds.

In one embodiment, the flow rate of first gaseous phase is constant during each step a).

This embodiment allows the first gaseous phase to be constantly renewed so that it is therefore constantly loaded with reactive species, and, therefore, the duration of the step a) is not limited by the depletion of the reactive species in the first gaseous phase. In this embodiment, the duration of the step a) is therefore limited by the time taken to heat the surfaces of the fibrous preforms.

In such an embodiment, the duration of each step a) may be between 1 and 30 minutes, for example between 3 and 10 minutes.

BRIEF DESCRIPTION OF THE DRAWINGS

FIG. 1 FIG. 1 is a schematic representation of a facility for carrying out a method of the invention.

FIG. 2 FIG. 2 is a schematic representation showing how characteristic quantities change in a first embodiment of the method.

FIG. 3 FIG. 3 is a schematic representation showing how characteristic quantities change in a second embodiment of the method.

DESCRIPTION OF THE EMBODIMENTS

The invention is now described in reference to figures that are provided purely in order to better describe certain embodiments and that should not be considered to be limiting.

FIG. 1 is a schematic representation of a facility 10 for carrying out a method described above. The facility 10 comprises a densification furnace 11 delimiting an enclosure 12. The enclosure 12 of the densification furnace 11 is loaded with the fibrous preforms to be densified, which are not shown.

As described above, the method then comprises repeating the steps a) and b) described above.

For example, the steps a) and b) may be repeated at least 5 times, or indeed at least 10 times. The number of repetitions is conditioned by the quantity of ceramic to be deposited.

Each time a step a) is carried out, the densification of the preform increases. Moreover, as indicated, the step b) helps ensure that there is a temperature gradient between the core and the surface of the preforms, meaning that the thermal decomposition of the first gaseous phase takes place more quickly in the core of the preforms than at their surfaces.

For example, the facility 10 comprises a source of the first gaseous phase 20 and a source of the second gaseous phase 21. These sources of gaseous phase 20, 21 are in fluidic communication, by means of pipes 16 and 15, respectively, with the inlet 14 situated at the bottom of the furnace 11.

All of the supply paths from the sources 20, 21 to the enclosure 12 may comprise valves, as shown.

In one embodiment, the first gaseous phase has a temperature greater than or equal to 1000° C. or indeed greater than or equal to 1100° C. when supplying the enclosure 12. If necessary, heating means, which are not shown in FIG. 1, may be present. For example, the reactive gases may be preheated outside the enclosure.

The facility 10 further comprises pumps and other means, which are not shown here, that make it possible to supply the enclosure with the first and second gaseous phases from the sources 20 and 21, respectively.

In one embodiment, which is shown, the path supplying gaseous phase from the sources 20, 21 to the enclosure 12 may further comprise a supply chamber 18, 19 on the path of the second or first gaseous phase, respectively. Such a supply chamber may be useful in an embodiment in which a specific quantity of first or second gaseous phase is to be introduced, as described below.

In other embodiments, these supply chambers 18, 19 may be absent.

In the embodiment shown in solid lines in FIG. 1, the pipes 15 and 16 for supplying first and second gaseous phase supply the furnace at the same end 14, in this case at the end situated at the bottom of the furnace 11. Such pipes 15 and 16 therefore allow the furnace to be supplied with a first and second gaseous phase circulating co-currently.

In an alternative embodiment, depicted in dotted lines, the supply pipe supplying first gaseous phase 17 may be connected to one end of the furnace 11 opposite the end supplied with the second gaseous phase. In FIG. 1, and in the alternative in dotted lines, the first gaseous phase supplies the enclosure 12 of the furnace 11 through its top end 13, and the second gaseous phase supplies the enclosure 12 of the furnace 11 through the bottom end 14, via the supply pipe 15.

Such an embodiment allows the first and second gaseous phases to circulate through the enclosure 12 counter-current to each other.

Naturally, the first or second gaseous phases may be supplied to the enclosure in a different way to those shown without departing from the scope of the invention. For example, the first and second gaseous phases may be supplied through the top end 13 of the furnace 11.

Similarly, FIG. 1 shows discharge circuits 24, 25 for discharging the gaseous phase out of the furnace. Although two circuits are shown in FIG. 1, only one of these two circuits may be present without departing from the scope of the invention.

These circuits allow the first and/or second gaseous phase to be discharged from the enclosure 12 of the furnace 11.

As described above, a step b) of supplying the enclosure 12 with second gaseous phase must be carried out while simultaneously placing the enclosure 12 under vacuum, such that the introduction of the second gaseous phase takes place at the same time as the expulsion of the first gaseous phase out of the enclosure 12.

For this purpose, the discharge circuits 24, 25 may, for example, be connected to a low-pressure chamber 22. Consequently, when the enclosure 12 is to be discharged, the low-pressure chamber is brought into fluidic communication with the enclosure 12. The low-pressure chamber 22 is at a lower pressure than the enclosure 12, and the gaseous phase present is therefore discharged.

For example, the low-pressure chamber 22 may be connected to a pump 23 which creates a vacuum in the low-pressure chamber 22.

In one embodiment that is not shown, the enclosure 12 may be purged directly by a pump when necessary.

As described above, the method of the invention comprises repeating steps a) and b).

FIG. 2 describes, schematically, the change in the partial pressure of first gaseous phase 110, the flow rate of first gaseous phase 111 and the partial pressure of second gaseous phase 112 in the enclosure 12 during implementation of a method. More specifically, FIG. 2 describes an embodiment in which the step a) is carried out by introducing a calibrated quantity of first gaseous phase into the reaction enclosure 12.

For example, a first step a) may be carried out by bringing the supply chamber 19 with a known volume to a given pressure, then supplying the enclosure 12 with the contents of this supply chamber 19, without any further supply of first gaseous phase. Carrying out this first step a) over a duration 100 results in a flow rate of first gaseous phase 111 varying between zero 303 and a maximum value 304, as shown in FIG. 2.

Similarly, the partial pressure of first gaseous phase 110 varies between zero 301 and a maximum value 302.

At the end of a chosen time duration 100, a step b) begins.

Alternatively, the duration 100 of the step a) may be determined by following the change in the temperature at the surface of the fibrous preforms, and the step a) is interrupted when the surface temperature becomes too high, for example greater than or equal to 1000° C.

This embodiment helps ensure that the temperature gradient between the core of the preforms and their surfaces is always sufficient to ensure that the formation of matrix takes place preferentially at the core of the preforms.

The step b) corresponds to the introduction of a second gaseous phase, resulting in an increase in the partial pressure of the second gaseous phase 112 between zero 305 and a maximum value 306.

This step also comprises placing the enclosure 12 under vacuum. Therefore, at the same time as the increase in the partial pressure of the second gaseous phase 112, a rapid decrease in the partial pressure of first gaseous phase 110 is observed, and the flow rate of first gaseous phase 111 returns to zero.

At the end of a defined duration 200, a step a) starts again.

Alternatively, the step b) may be interrupted when the surface temperature of the fibrous preforms falls below a target value again, for example less than or equal to 800° C. This makes it possible to ensure that the desired temperature gradient between the inside and the outside of the fibrous preforms is sufficient in order to obtain preferential deposition of the matrix at the core of the fibrous preforms while making the step b) last as little time as necessary.

FIG. 2 shows four alternating steps a) 100, 101, 102, 103 and b) 200, 201, 202, 203, but a different number of steps a) and b) may be chosen without departing from the scope of the invention.

FIG. 3 shows, schematically, the change in the partial pressure of first gaseous phase 210, the flow rate of first gaseous phase 211 and the partial pressure of second gaseous phase 212 in the enclosure 12 during implementation of a method in another embodiment, in which the flow rate of first gaseous phase is constant during steps a).

In such an embodiment, unlike the embodiment shown in FIG. 2, the enclosure 12 is supplied with a flow rate of first gaseous phase 211 that varies between zero 307 during steps b) and a constant value 308 during steps a).

This embodiment may be obtained in the absence of the supply chamber 19 for supplying the enclosure 12 with a calibrated quantity of first gaseous phase. For example, in such an embodiment, the source 20 of first gaseous phase may directly supply the enclosure 12 during steps a).

FIG. 3 shows a first step a) during which the flow rate 211 of first gaseous phase is constant, and of a chosen value 308. This step allows densification of the preforms for a duration 100.

Next, after this step a), a step b) may be carried out, during which the flow rate 211 of first gaseous phase is zero 307. The partial pressure of first gaseous phase 210 drops, at the same time that the partial pressure of second gaseous phase 212 increases in the enclosure 12.

This step b) makes it possible to purge the enclosure 12 of the first gaseous phase, and to restore the necessary temperature gradient between the core and the surface of the fibrous preforms.

FIG. 3 shows four alternating steps a) 100, 101, 102, 103 and b) 200, 201, 202, 203, but a different number of steps a) and b) may be chosen without departing from the scope of the invention.

The invention claimed is:

1. A method for densification by Chemical Vapor Infiltration of a plurality of fibrous preforms arranged in an enclosure of a densification furnace, the method comprising at least the following steps a) and b), each being repeated more than once:
   a) introducing a first gaseous phase, a thermal decomposition of which allows a matrix to form in pores of the plurality of fibrous preforms;
   b) introducing a second gaseous phase while simultaneously placing the enclosure of the densification furnace under vacuum, such that the introduction of the second gaseous phase takes place at the same time as an expulsion of the first gaseous phase out of the enclosure, the temperature of the second gaseous phase being less than or equal to 25° C. when it is introduced into the enclosure of the densification furnace,
   wherein the second gaseous phase comprises hydrogen, helium, nitrogen or a mixture of these substances, and
   wherein, when a temperature at a surface of the preform is greater than a first predetermined temperature threshold, the method comprises interrupting step a) and initiating step b).

2. The densification method according to claim 1, wherein the fibrous preforms comprise silicon carbide fibers.

3. The densification method according to claim 1, wherein the first gaseous phase comprises methyltrichlorosilane and hydrogen.

4. The densification method according to claim 1, wherein a pressure applied in the enclosure of the densification furnace during the step b) is less than or equal to 200 mbar.

5. The densification method according to claim 1, wherein a duration of the steps b) is less than or equal to 5 minutes.

6. The densification method according to claim 1, wherein step b) is interrupted by a new step a) when a temperature at a surface of the fibrous preforms is less than or equal to 800° C.

7. The densification method according to claim 1, wherein the first and second gaseous phases circulate co-currently.

8. The densification method according to claim 1, wherein the first and second gaseous phases circulate counter-current to each other.

9. The densification method according to claim 1, wherein a calibrated quantity of first gaseous phase is introduced during each step a).

10. The densification method according to claim 1, wherein a flow rate of first gaseous phase is constant during each step a).

11. The densification method according to claim 1, wherein the first gaseous phase has a predetermined composition and the method comprises a sequence that consists of (i) performing step a), (ii) interrupting step a) to perform step b), (iii) performing step b), (iv) interrupting step b) to perform step a) and then (v) performing step a) to introduce said first gaseous phase in the enclosure.

12. The densification method according to claim 1, wherein the first predetermined temperature threshold is 1000° C.

13. The densification method according to claim 1, wherein, when the temperature at the surface of the preform is lower than a second predetermined temperature threshold, the method comprises interrupting step b) and initiating step a).

14. The densification method according to claim 13, wherein the second predetermined temperature threshold is 800° C.

15. The densification method according to claim 1, wherein the second gaseous phase comprises hydrogen.

* * * * *